(12) United States Patent
Lee et al.

(10) Patent No.: US 7,752,529 B2
(45) Date of Patent: Jul. 6, 2010

(54) COMBINED LDPC (LOW DENSITY PARITY CHECK) ENCODER AND SYNDROME CHECKER

(75) Inventors: Tak K. Lee, Irvine, CA (US); Ba-Zhong Shen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 981 days.

(21) Appl. No.: 11/493,342

(22) Filed: Jul. 26, 2006

(65) Prior Publication Data

US 2008/0052593 A1 Feb. 28, 2008

(51) Int. Cl.
*H03M 13/00* (2006.01)
(52) U.S. Cl. .................. 714/785; 714/752; 714/758
(58) Field of Classification Search .......... 714/758, 714/785, 752, 781
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 6,430,233 B1 | 8/2002 | Dillon et al. | |
| 6,473,010 B1 | 10/2002 | Vityaev et al. | |
| 6,567,465 B2 | 5/2003 | Goldstein et al. | |

| 6,633,856 B2 * | 10/2003 | Richardson et al. ........... 706/15 |
|---|---|---|

(Continued)

OTHER PUBLICATIONS

David Haley, Alex Grant, and John Buetefuer, "Iterative Encoding of Low-Density Parity-check Codes," Globecom '02. 2002—IEEE Global Telecommunications Conference. Conference Proceedings, Taipei, Taiwan, Nov. 17-21, 2002, IEEE Global Telecommunications Conference, New York, NY: IEEE, US, vol. 2, Nov. 17, 2002, pp. 1289-1293, XP010636353, ISBN: 978-0-7803-7632-8.

(Continued)

*Primary Examiner*—Sam Rizk
(74) *Attorney, Agent, or Firm*—Garlick Harrison & Markison; Shayne X. Short (57) ABSTRACT

Combined LDPC (Low Density Parity Check) encoder and syndrome checker. A novel approach is presented by which the encoding processing and at least a portion of the decoding processing of an LDPC coded signal can be performed using a shared circuitry. The LDPC encoding processing and syndrome calculation operations (in accordance with the LDPC decoding processing) can be performed using a common circuitry having a portion of which whose connectivity is only slightly modified depending on whether encoding or decoding is being performed. To effectuate this selection (between encoding and decoding), any of a variety of means can be employed including the use of multiplexers that are operable to select a first connectivity (for encoding) and a second connectivity (for decoding). This can result in a hardware savings of space, cost, and complexity since a shared circuitry can perform both encoding and at least part of the decoding processing.

20 Claims, 9 Drawing Sheets

U.S. PATENT DOCUMENTS

| | | | |
|---|---|---|---|
| 6,789,227 B2 * | 9/2004 | De Souza et al. | 714/804 |
| 6,895,547 B2 * | 5/2005 | Eleftheriou et al. | 714/801 |
| 7,073,114 B2 * | 7/2006 | Massey | 714/755 |
| 2002/0051501 A1 * | 5/2002 | Demjanenko et al. | 375/298 |
| 2003/0104788 A1 | 6/2003 | Kim | |
| 2005/0283707 A1 | 12/2005 | Sharon et al. | |

OTHER PUBLICATIONS

R. G. Gallager, "Low density parity check codes," IRE Trans. Info. Theory, vol. IT-8, Jan. 1962, pp. 21-28.

R. Gallager, Low-Density Parity-Check Codes, Cambridge, MA: MIT Press, 1963, 90 pages.

M. Luby, M. Mitzenmacher, M. A. Shokrollahi, D. A. Spielman, and V. Stemann, "Practical Loss-Resilient Codes", Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, No. 2, Feb. 2001, pp. 599-618.

* cited by examiner

COMBINED LDPC (LOW DENSITY PARITY CHECK) ENCODER AND SYNDROME CHECKER

BACKGROUND OF THE INVENTION

1. Technical Field of the Invention

The invention relates generally to communication systems; and, more particularly, it relates to encoding and decoding processing of LDPC (Low Density Parity Check) signals within such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

In such prior art communication devices, the requirement to include both encoder and decoder functionality therein can increase the complexity of the communication device. This is sometimes consumptive of real estate which also typically increases overall cost. There is continually a need in the art for more efficient, smaller, and more cost-effective means by which such communication devices can be designed and implemented.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Many communication systems incorporate the use of an LDPC code. While in some applications the encoder and decoder may be in use simultaneously, there are also many applications (e.g., in a hard disk drive (HDD) application) where their operations are mutually exclusive. A novel approach is presented herein which allows a shared circuitry (and/or functional block) to perform both encoding processing as well as the syndrome checking required during decoding processing. In applications in which the encoding and decoding are mutually exclusive operations (i.e., only one is performed at a time), this combined encoder and syndrome checker allows for the construction of a circuitry (and/or functional block) by adding only minimal selection functionality to the syndrome checker of the decoder, thus rendering the encoder virtually costless. In applications in which may need to be performed within a communication system that operates in a duplex manner (i.e., with substantially simultaneous receipt and transmission of signals), a memory can be implemented to allow for memory management of one of the signals while the other is being processed (e.g., within a ping-pong memory configuration or other memory configuration which allows for use of the shared processing resources for a first signal during a first time and use of the shared processing resources for a second signal during a second time).

Figure 1:
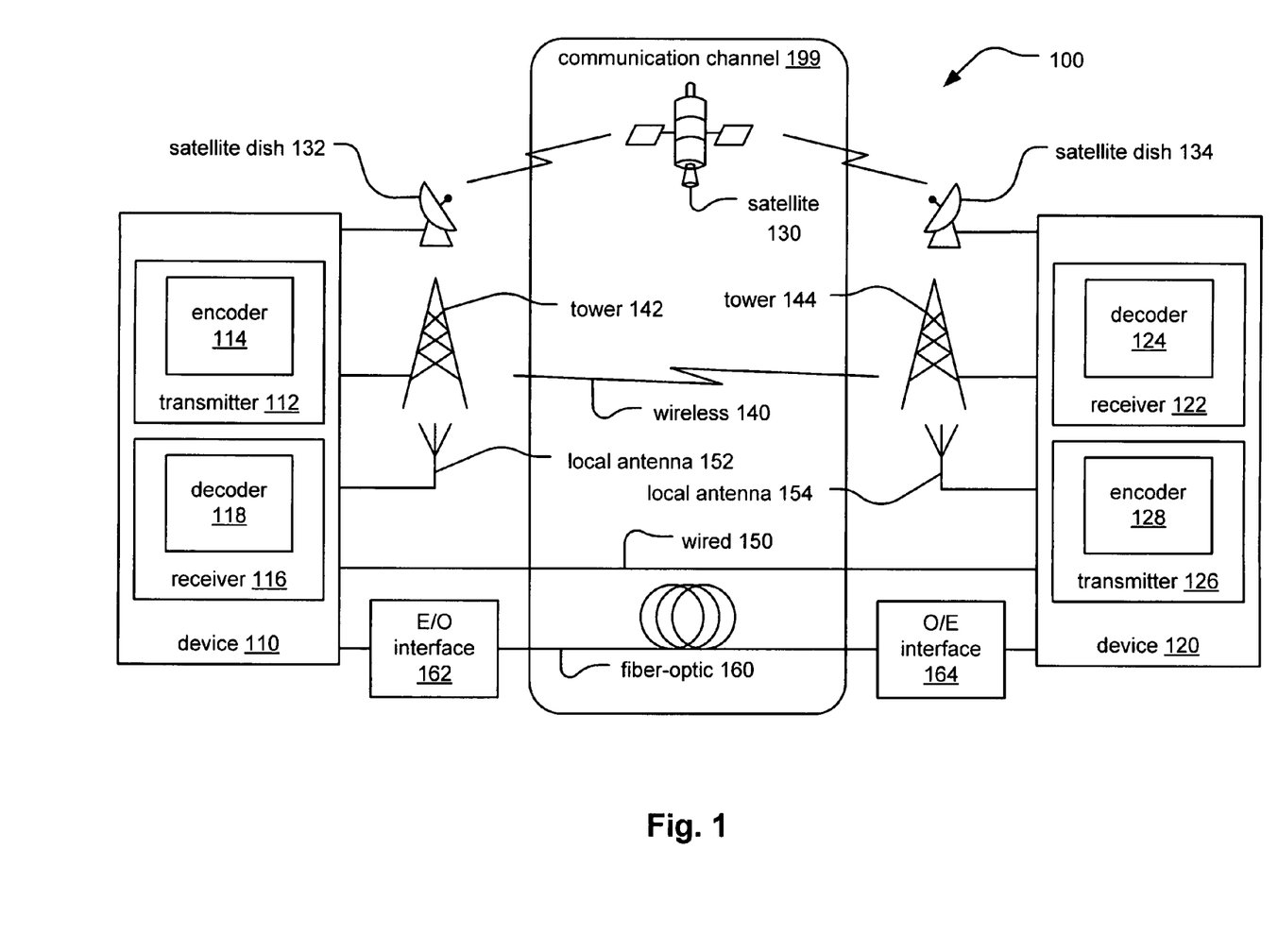
FIG. 1 illustrates an embodiment of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Figure 2:
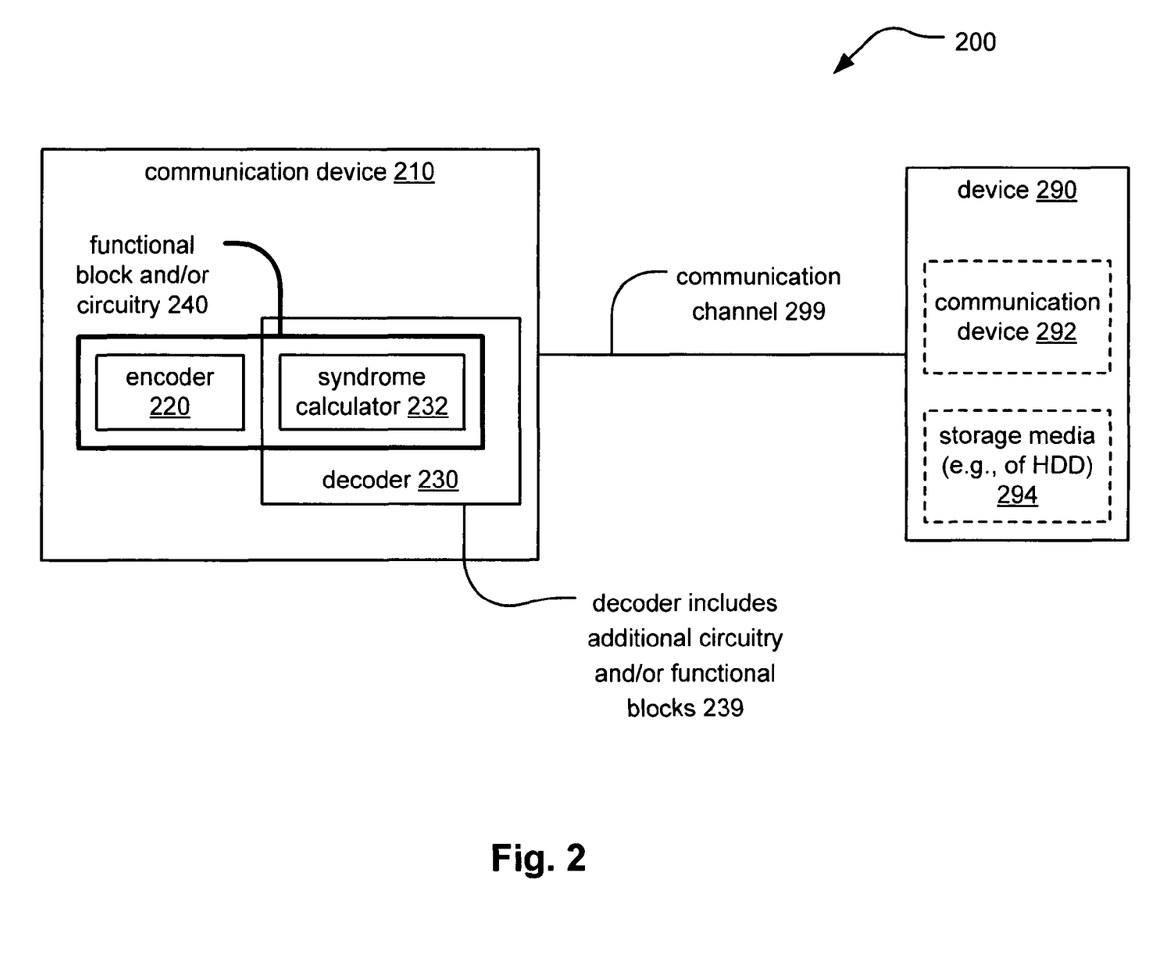
FIG. 2 and FIG. 3 illustrate other various embodiments of communication systems.
Figure 3:
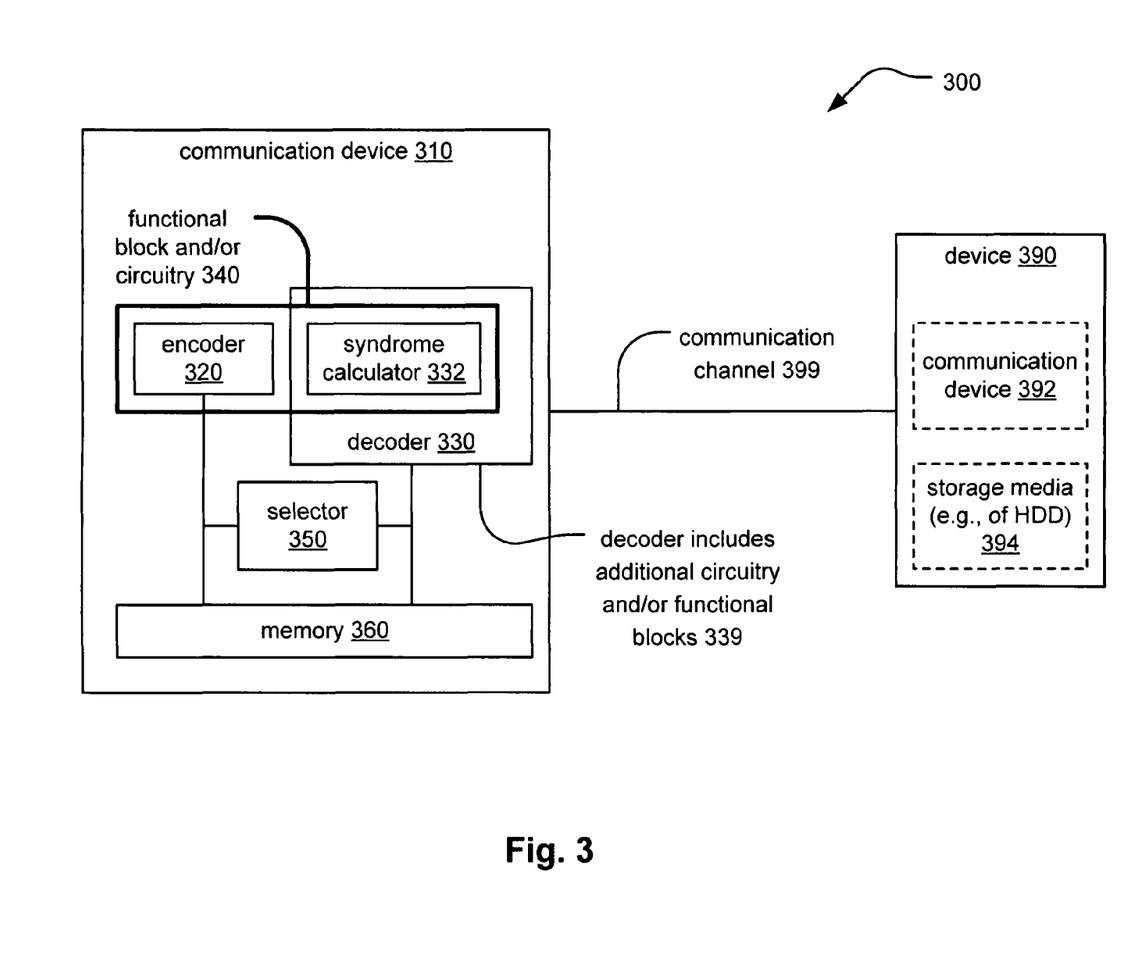

FIG. 2 and FIG. 3 illustrate other various embodiments of communication systems.

Referring to FIG. 2, a communication system 200 includes a communication device 210 that is coupled to another device 290 via a communication channel 299. The communication device 210 includes both an encoder 220 and a decoder 230. A shared functional block and/or circuitry portion (shown as functional block and/or circuitry 240) that includes both the encoder 220 and a syndrome calculator 232 that is employed during decoding processing by the decoder 230. It is noted that the decoder 230 can also include additional circuitry and/or functional blocks as required and/or desired to effectuate the decoding processing of LDPC coded signals thereby, as indicated by the reference numeral 239.

It is also noted that the functional block and/or circuitry 240 can be implemented strictly as circuitry (e.g., employing certain logic gates such as exclusive-OR (XOR) gates and selection functionality such as with MUXs (multiplexors)). The functional block and/or circuitry 240 can be implemented strictly in software such as can be employed within a digital signal processor (DSP) or similar type device. Alternatively, the functional block and/or circuitry 240 can be implemented as a combination of hardware and software as well without departing from the scope and spirit of the invention.

In even other embodiments, the functional block and/or circuitry 240 can be implemented can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The functional block and/or circuitry 240 can be coupled to a memory that is operable to store operational instructions that enable to functional block and/or circuitry 240 to perform the encoding and syndrome calculation processing as required during encoding processing and decoding processing of LDPC coded signals.

Such a memory may be a single memory device or a plurality of memory devices. Such a memory device may be a read-only memory, random access memory, volatile memory, non-volatile memory, static memory, dynamic memory, flash memory, and/or any device that stores digital information. Note that when the functional block and/or circuitry 240 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

The other device 290 to which the communication device 299 is coupled via the communication channel can be another communication device 292, a storage media (e.g., such as within the context of a hard disk drive (HDD)), or any other type of device that is capable to receive or transmit signals. In some embodiments, the communication channel 299 is a bi-directional communication channel that is operable to perform transmission of a first signal during a first time and receiving of a second signal during a second time.

Referring to FIG. 3, a communication system 300 includes a communication device 310 that is coupled to another device 390 via a communication channel 399. The communication device 310 includes both an encoder 320 and a decoder 330. A shared functional block and/or circuitry portion (shown as functional block and/or circuitry 340) that includes both the encoder 320 and a syndrome calculator 332 that is employed during decoding processing by the decoder 330. It is noted that the decoder 330 can also include additional circuitry and/or functional blocks as required and/or desired to effectuate the decoding processing of LDPC coded signals thereby, as indicated by the reference numeral 339.

In addition, the communication device 310 includes a memory 360 that is coupled to each of the encoder 320 and decoder 330. The memory 360 is operable to store a first LDPC coded signal while either the encoder 320 performs encoding processing on a second LDPC coded signal or the decoder 330 performs decoding processing on the second LDPC coded signal. The memory 360 allows the communication device 310 to perform processing (e.g., encoding or decoding) on one LDPC coded signal while another LDPC coded signal is stored in the memory 360. When the communication device 310 is coupled to a communication channel 399 that allows only transmission or receiving at a given time (e.g., such as within a communication channel coupled to a HDD that allows only read or write access at any given time), the memory 360 if operable to assist in the appropriate buffering and memory management of the various LDPC coded signal.

It is also noted that the functional block and/or circuitry 340 can be implemented strictly as circuitry (e.g., employing certain logic gates such as exclusive-OR (XOR) gates and selection functionality such as with MUXs (multiplexors)). The functional block and/or circuitry 340 can be implemented strictly in software such as can be employed within a digital signal processor (DSP) or similar type device. Alternatively, the functional block and/or circuitry 340 can be implemented as a combination of hardware and software as well without departing from the scope and spirit of the invention.

In even other embodiments, the functional block and/or circuitry 340 can be implemented can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The functional block and/or circuitry 340 can be coupled to a memory that is operable to store operational instructions that enable to functional block and/or circuitry 340 to perform the encoding and syndrome calculation processing as required during encoding processing and decoding processing of LDPC coded signals.

Such a memory may be a single memory device or a plurality of memory devices. Such a memory device may be a read-only memory, random access memory, volatile memory, non-volatile memory, static memory, dynamic memory, flash memory, and/or any device that stores digital information. Note that when the functional block and/or circuitry 340 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In addition, a selector 350 is also situated in cooperation with the memory 360 such that the storing or retrieving of a first signal to or from the memory 360 does not conflict with the storing or retrieving of a second signal to or from the memory 360. This selector 350 also effectuates any connectivity modifications that need to be performed when the functional block and/or circuitry 340 performs encoding processing vs. decoding processing.

The other device 390 to which the communication device 399 is coupled via the communication channel can be another communication device 392, a storage media (e.g., such as within the context of a HDD), or any other type of device that is capable to receive or transmit signals. In some embodiments, the communication channel 399 is a bi-directional communication channel that is operable to perform transmission of a first signal during a first time and receiving of a second signal during a second time. In even other embodiments, the communication channel 399 is a bi-directional communication channel that is operable to perform duplex operation (i.e., simultaneous transmission of a first signal and receiving of a second signal during at substantially the same time).

The following description is provided to assist the reader in understanding why and how the encoding and syndrome checking operations can be combined within a functional block and/or circuitry.

Let H be an m×n parity check matrix for a (n,k) LDPC code. Then, H can be rewritten as [U|T], where U is a m×k sub-matrix, and T is a m×(n−k) sub-matrix. H can always be manipulated so that T is quasi-lower-triangular in nature (i.e., its component $t_{i,j}$ is zero whenever i<j and $t_{i,i}=1$). In other words, the second sub-matrix, T, is a lower triangular matrix such that each non-zero valued element within the second sub-matrix is situated either along a diagonal of the second sub-matrix, T, or below the diagonal of the second sub-matrix. It can be seen also that the columns within the sub-matrix, U, correspond to encoding the information bits according to a systematic LDPC code, and the columns within the sub-matrix, T, correspond to generating the parity (which are sometimes referred to as redundancy or coded bits). The diagonal being defined as traversing the second sub-matrix, T, from an upper-left-most element of the second sub-matrix to a lower-right-most element of the second sub-matrix. This quasi-lower-triangular nature of the sub-matrix, T, allows for the feedback type implementation of a first parity bit to be used in generating a second parity, and so on, during encoding processing.

Let $x_0, x_1, \ldots, x_{k-1}$ be the information bits. Then, an encoder can compute the parity bits $p_0, p_1, \ldots, p_{n-k-1}$ using the following formula:

$$p_i = \sum_{j=0}^{k-1} x_j u_{i,j} + \sum_{j=0}^{i-1} p_j t_{i,j}$$

As can be seen, this encoding processing can be applied to generate a systemic LDPC coded signal, such that after undergoing encoding processing of the information bits, $x_0, x_1, \ldots, x_{k-1}$, the resultant codeword also includes those same information bits, $x_0, x_1, \ldots, x_{k-1}$, and the parity bits, $p_0, p_1, \ldots, p_{n-k-1}$.

On the other hand, let $y_0, y_1, \ldots, y_{n-1}$ be the current estimated codeword. One of the steps in an iterative LDPC decoder is to check to see if the syndromes $s_0, s_1, \ldots, s_{m-1}$ are all zero. In other words, based on the current estimate of the codeword, $y_0, y_1, \ldots, y_{n-1}$, it is determined whether or not the dot product of each row is zero (i.e., whether $0=Hy^t$, where $y^t$ is the transpose of the current estimate of the codeword, $y_0, y_1, \ldots, y_{n-1}$). Each syndrome, $s_i$, can be computed by the following formula.

$$s_i = \sum_{j=0}^{k-1} y_j u_{i,j} + \sum_{j=0}^{i} y_{k+j} t_{i,j}$$

Note the similarity of the two formulae. For example, if one sets $y_0, y_1, \ldots, y_{k-1}$ to $x_0, x_1, \ldots, x_{k-1}$ and $y_k, y_{k+1}, \ldots, y_{n-1}$ to all zeros, then $s_0$ given by the syndrome formula is the same as $p_0$, the first parity bit generated by the encoder. Subsequently, if all the $y_i$'s remain the same except that $y_k$ is set to $p_0$, then $s_1$ given by the syndrome formula is the same as $p_1$. Repeating this argument, it can be shown that all the $p_i$ can be generated by the syndrome formula by repeatedly replacing $y_{k+i-1}$ by $p_{i-1}$.

Figure 4:
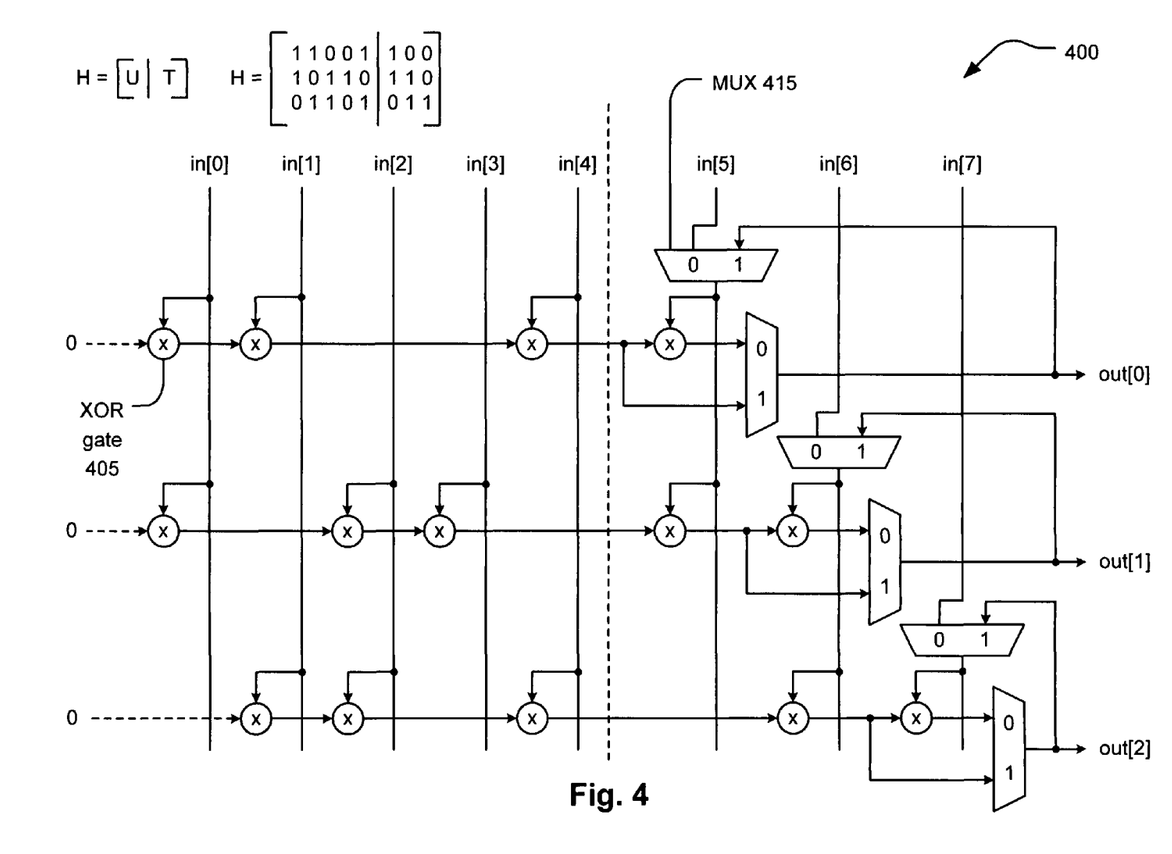
FIG. 4 illustrates an embodiment of combined encoder and syndrome checker.

FIG. 4 illustrates an embodiment of combined encoder and syndrome checker 400. For illustrative purposes, the following low density parity check matrix, H, is considered:

$$H = \begin{bmatrix} 1 & 1 & 0 & 0 & 1 & 1 & 0 & 0 \\ 1 & 0 & 1 & 1 & 0 & 1 & 1 & 0 \\ 0 & 1 & 1 & 0 & 1 & 0 & 1 & 1 \end{bmatrix}.$$

This low density parity check matrix, H, has the same properties and partitioning as described above as follows:

$$H = [U \mid T];$$

$$U = \begin{bmatrix} 1 & 1 & 0 & 0 & 1 \\ 1 & 0 & 1 & 1 & 0 \\ 0 & 1 & 1 & 0 & 1 \end{bmatrix}; \text{ and}$$

$$T = \begin{bmatrix} 1 & 0 & 0 \\ 1 & 1 & 0 \\ 0 & 1 & 1 \end{bmatrix}.$$

As can be seen, each non-zero element of the low density parity check matrix, H, is represented with a corresponding exclusive-OR (XOR) gate. An XOR gate 405 is shown with a corresponding reference numeral, and each of the similar looking elements in the diagram is also an XOR gate. There are a number of MUXs whose selection is based upon whether the combined encoder and syndrome checker 400 is performing encoding processing or syndrome checking (as performed during decoding processing). The MUXs are only required to effectuate the processing according to the T sub-matrix of the overall low density parity check matrix, H. This demarcation is shown as the dotted line running vertically in approximately the middle of the diagram.

A MUX 415 is shown with a corresponding reference numeral, and each of the similar looking elements in the diagram is also a MUX.

It is noted that each of the MUXs is connected according to the "0" when the combined encoder and syndrome checker 400 is performing syndrome checking, and each of the MUXs is connected according to the "1" when the combined encoder and syndrome checker 400 is performing encoding. In other words, to use this combined encoder and syndrome checker 400 to perform the syndrome calculations as required during decoding processing, the select signal of all the MUXs is set to "0" and each of the inputs, in[0], in[1], . . . , in[7], is set to $y_0, y_1, \ldots, y_7$; the syndromes $s_0, s_1, s_2$ will then appear on out[0], out[1], out[2].

Alternatively, to use this combined encoder and syndrome checker 400 as an encoder, the select signal of all the MUXs is set to "1" and each of the inputs, in[0], in[1], in[2], in[3], in[4] is set to $x_0, x_1, \ldots, x_4$. During encoding processing, the parity bits $p_0, p_1, p_2$ will then appear on out[0], out[1], out[2]. (NOTE: during encoding, all 8 of the inputs, in[0], in [1], . . . , in[7], are NOT used as inputs, but only those of in[0], in[1], in[2], in[3], in[4], or corresponding to the sub-matrix, U, are used).

Looking at this functionality another way, the circuitry of the combined encoder and syndrome checker 400 includes a plurality of XOR (exclusive OR) logic gates, implemented in an array arrangement such that each XOR gate of the plurality of XOR gates corresponds to a non-zero element of the LDPC matrix, and a plurality of MUXs (multiplexors) that is operable to modify the connectivity of a subset of the plurality of XOR gates that corresponds to at least one column of the LDPC matrix that is employed to generate a parity bit during encoding processing. A select signal is operable to select a first connectivity of each MUX when the circuitry performs encoding of a first information bit to form a first LDPC coded signal, and the select signal is operable to select a second connectivity of each MUX when the circuitry performs decoding processing on a second LDPC coded signal.

The selection functionality that is performed by the MUXs can be implemented within a variety of ways. For example, other selection functionality can be implemented to effectuate the switching between the encoding and syndrome calculation functionality within the combined encoder and syndrome checker 400.

Figure 5:
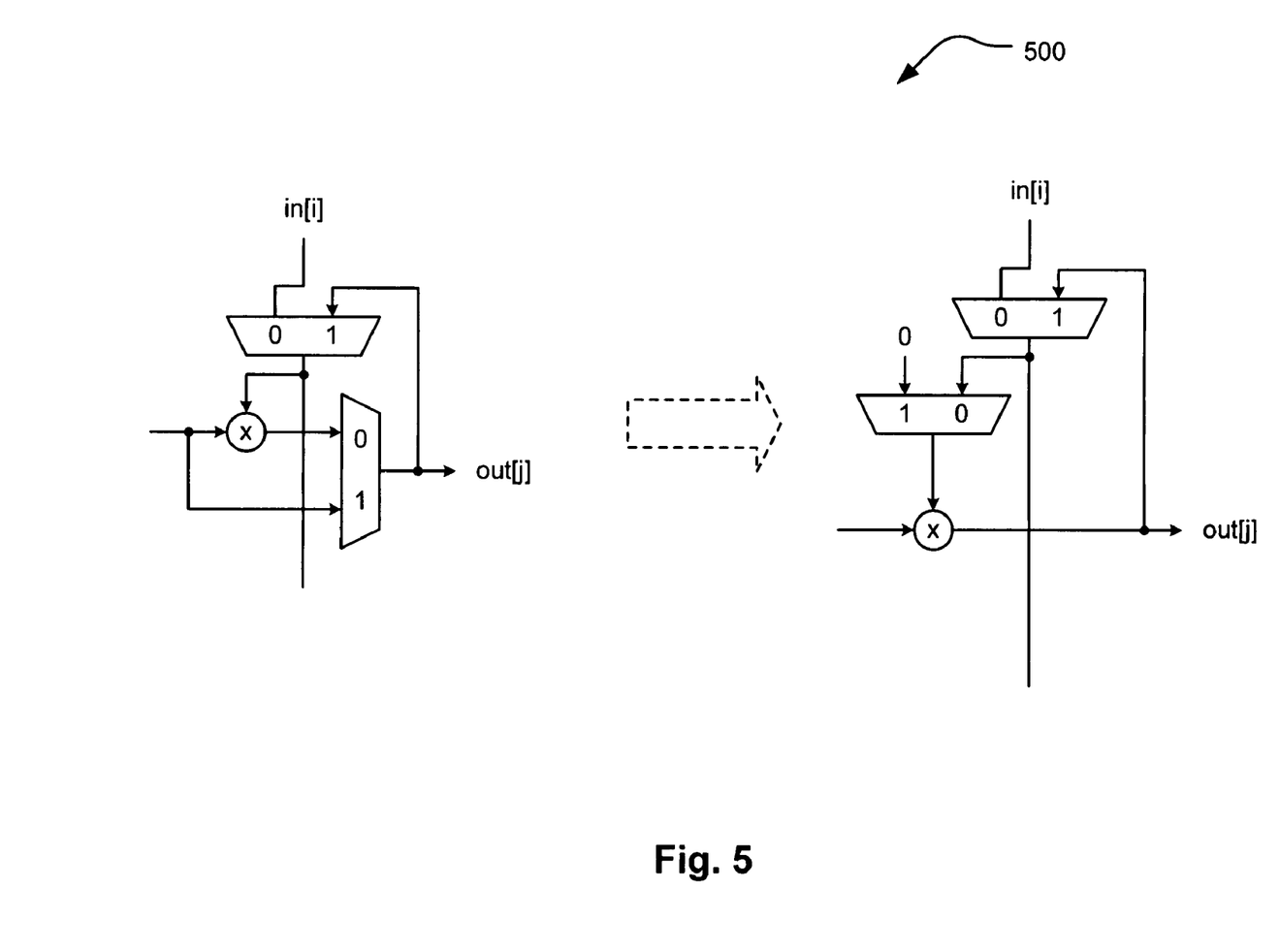
FIG. 5 illustrates an alternative embodiment of selecting functionality as employed within the combined encoder and syndrome checker of FIG. 4.

FIG. 5 illustrates an alternative embodiment of selecting functionality 500 as employed within the combined encoder and syndrome checker 400 of FIG. 4. This selecting functionality 500, as implemented using two MUXs, is shown in the left hand side as being equivalent to that employed within FIG. 4. As can be seen, the same connectivity is achieved in the alternative embodiment depicted on the right hand side.

Figure 6:
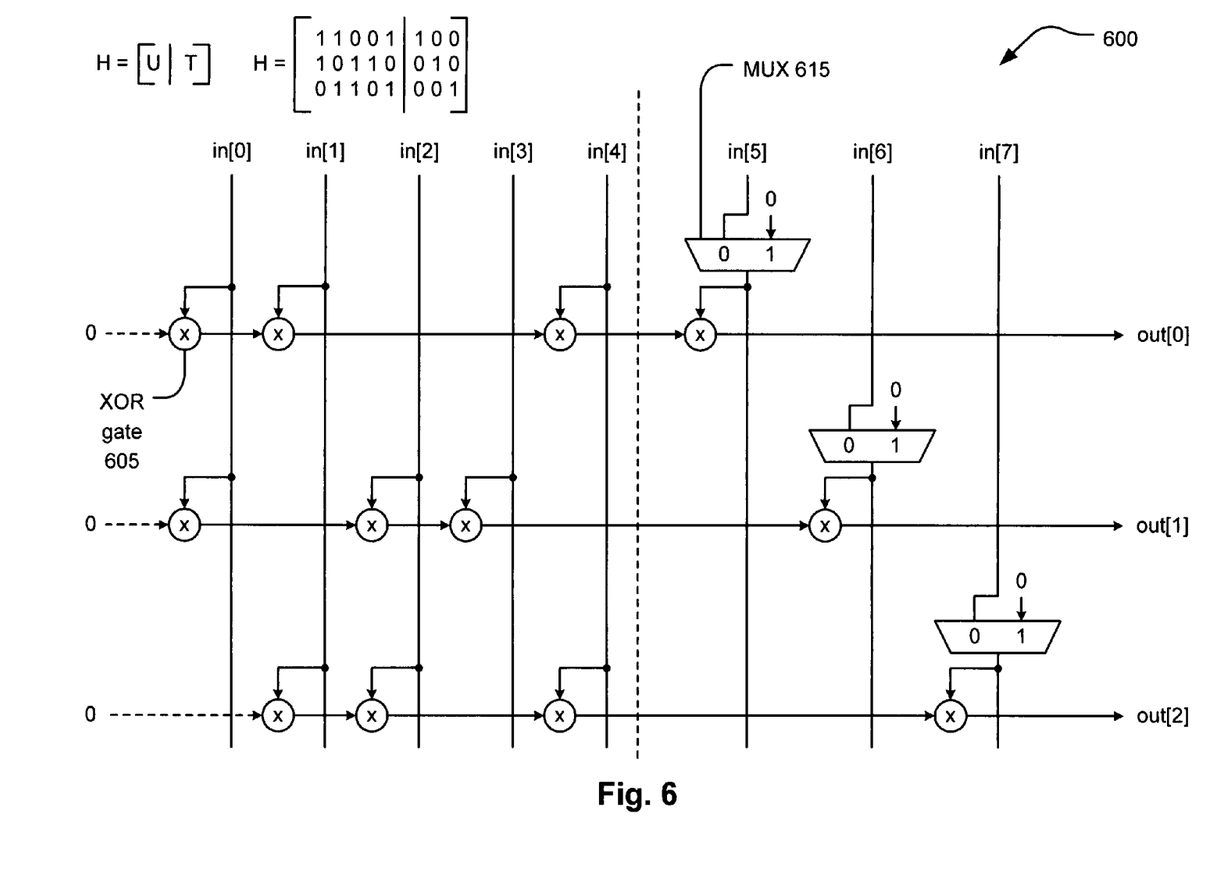
FIG. 6 illustrates an embodiment of combined encoder and syndrome checker as implemented for a low density parity check matrix, H, that is quasi-diagonal.

FIG. 6 illustrates an embodiment of combined encoder and syndrome checker 600 as implemented for a low density parity check matrix, H, that is quasi-diagonal.

Further simplification is possible if T is quasi-diagonal matrix, i.e., $t_{i,i}=1$ and $t_{i,j}=0$ whenever $i \neq j$ and $i<k$. For example, if $$H = \begin{bmatrix} 1 & 1 & 0 & 0 & 1 & | & 1 & 0 & 0 \\ 1 & 0 & 1 & 1 & 0 & | & 0 & 1 & 0 \\ 0 & 1 & 1 & 0 & 1 & | & 0 & 0 & 1 \end{bmatrix},$$

then a possible implementation of an encoder/syndrome-checker is shown by the combined encoder and syndrome checker 600.

As within [previous embodiments, this quasi-diagonal low density parity check matrix, H, also has the same properties and partitioning as described above as follows:

$$H = [U \mid T];$$

$$U = \begin{bmatrix} 1 & 1 & 0 & 0 & 1 \\ 1 & 0 & 1 & 1 & 0 \\ 0 & 1 & 1 & 0 & 1 \end{bmatrix}; \text{ and}$$

$$T = \begin{bmatrix} 1 & 0 & 0 \\ 0 & 1 & 0 \\ 0 & 0 & 1 \end{bmatrix}.$$

As within the embodiment of FIG. 4, each of the MUXs is connected according to the "0" when the combined encoder and syndrome checker 600 of FIG. 6 is performing syndrome checking, and each of the MUXs is connected according to the "1" when the combined encoder and syndrome checker 600 of FIG. 6 is performing encoding. A reduction in complexity is achieved when the sub-matrix, T, of the low density parity check matrix, H, is diagonal in nature.

Figure 7:
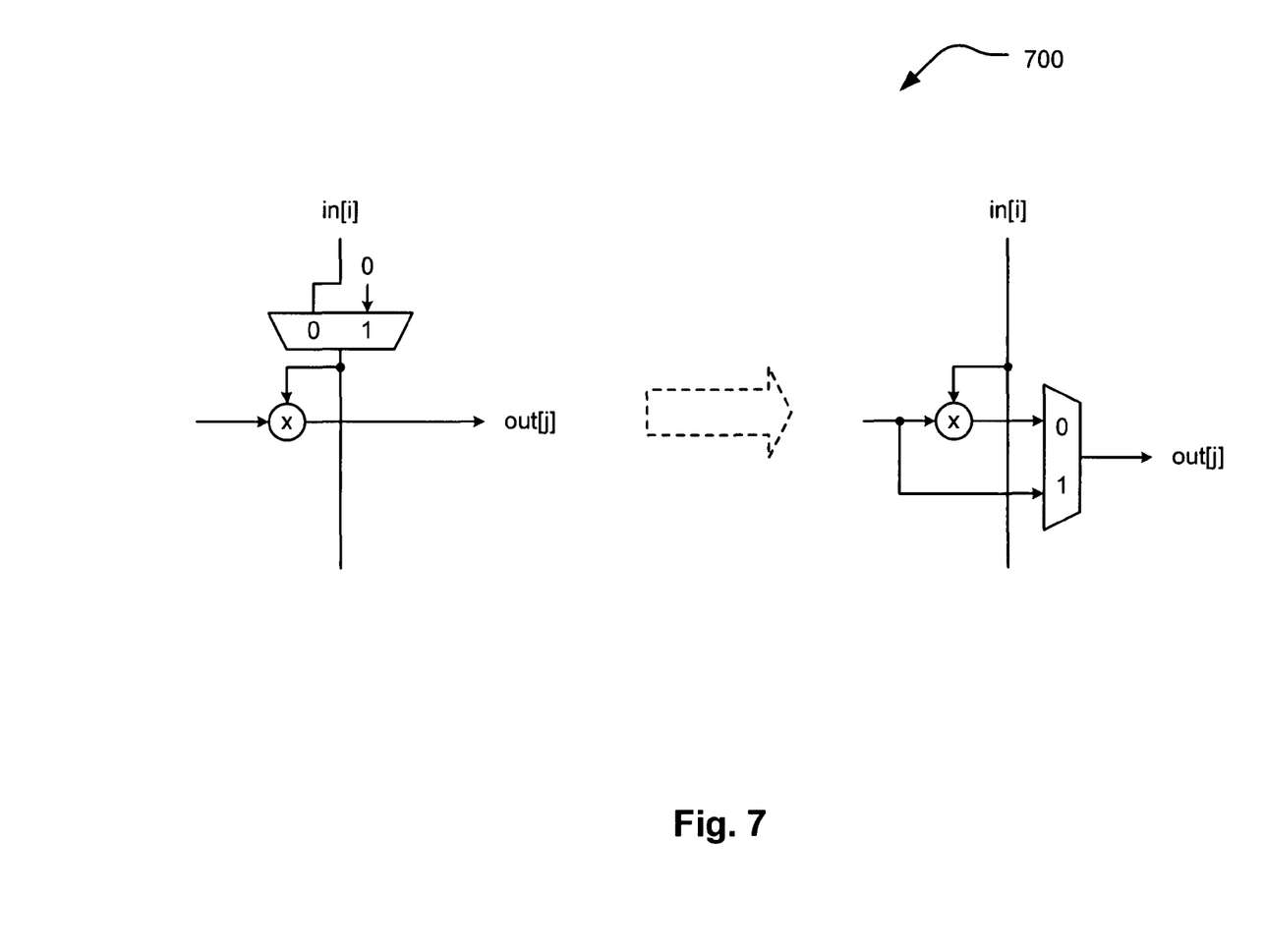
FIG. 7 illustrates an alternative embodiment of selecting functionality as employed within the combined encoder and syndrome checker of FIG. 6.

FIG. 7 illustrates an alternative embodiment of selecting functionality 700 as employed within the combined encoder and syndrome checker 600 of FIG. 6. This selecting functionality 700, as implemented using two MUXs, is shown in the left hand side as being equivalent to that employed within FIG. 6. As can be seen, the same connectivity is achieved in the alternative embodiment depicted on the right hand side.

The configurations depicted in the previous embodiments are merely one possible way in which the connectivity can be implemented. The sharing of hardware for an LDPC encoder and the syndrome checker of its corresponding LDPC decoder can be achieved in many other circuit realizations as well without departing from the scope and spirit of the invention.

In particular, the XOR chains in some of these previous embodiments can be replaced by XOR trees and/or the calculations can be computed in pipeline stages or with time-multiplexing, among other possible variations and embodiments. In all these cases, an approach analogous to that which is described herein, within the various embodiments, can be employed so that a syndrome checker can be enhanced to perform encoding as well. This can provides for a reduction in overall size of an actual communication device, which can also provide a savings of overall cost in some instances as well.

Figure 8:
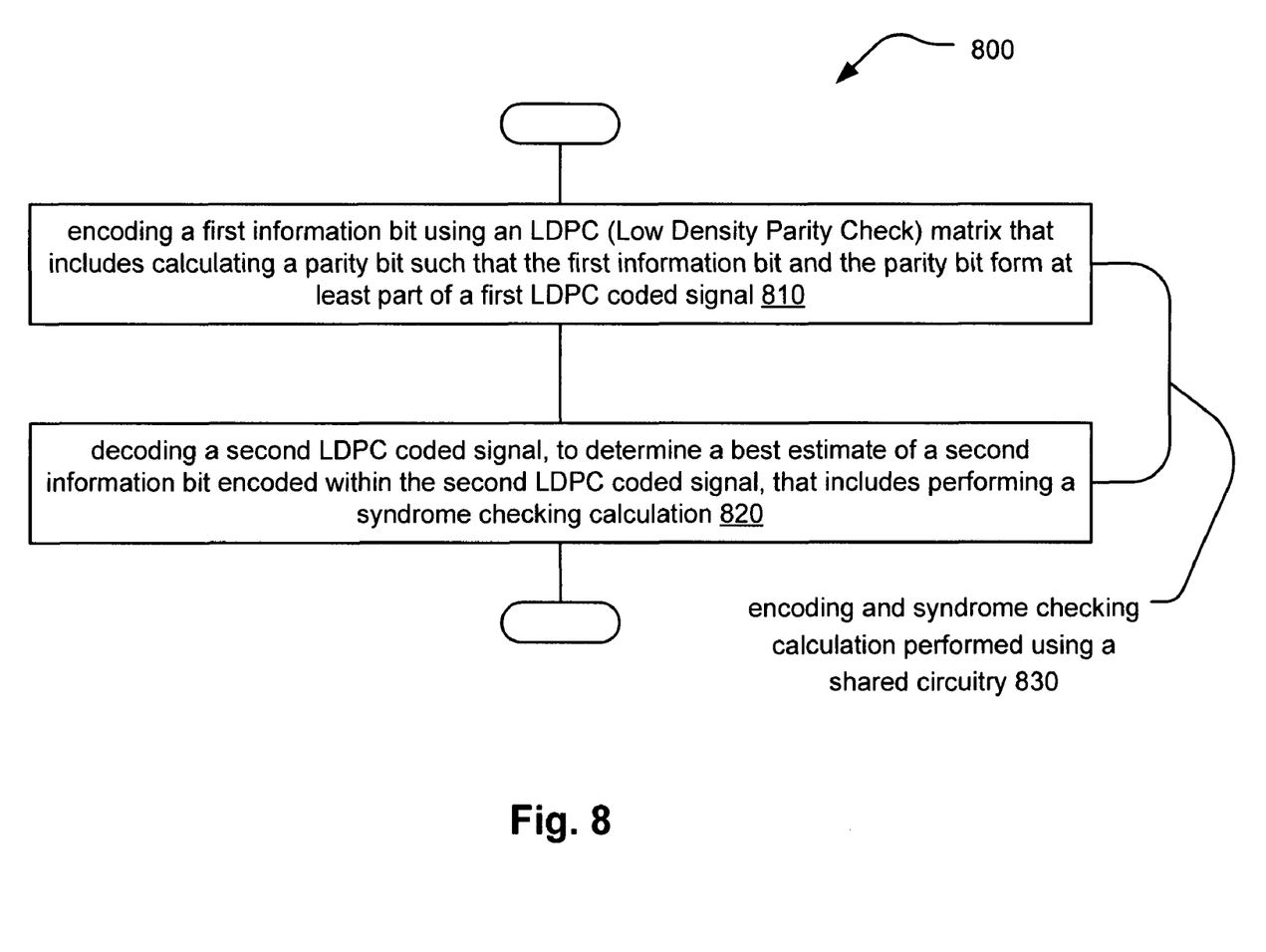
FIG. 8 and FIG. 9 illustrate embodiments of methods that are operable to perform encoding and decoding of LDPC coded signals.
Figure 9:
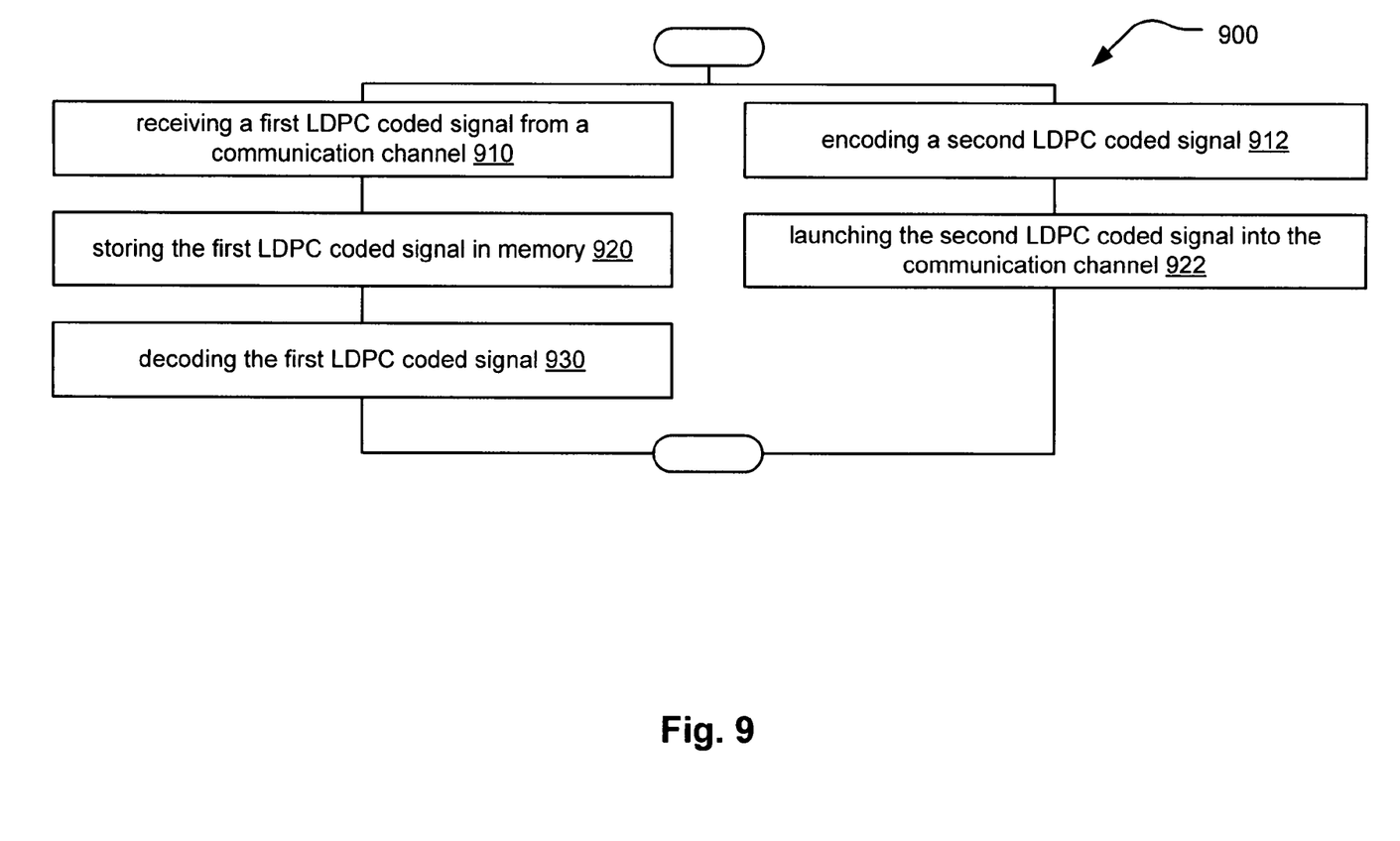

FIG. 8 and FIG. 9 illustrate embodiments of methods that are operable to perform encoding and decoding of LDPC coded signals.

Referring to FIG. 8, a method 800 begins by encoding a first information bit using an LDPC (Low Density Parity Check) matrix that includes calculating a parity bit such that the first information bit and the parity bit form at least part of a first LDPC coded signal, as shown in a block 810. Then, the method 800 continues by decoding a second LDPC coded signal, to determine a best estimate of a second information bit encoded within the second LDPC coded signal, that includes performing a syndrome checking calculation, as shown in a block 820. It is noted that the encoding and syndrome checking calculation performed using a shared circuitry, as depicted by reference numeral 830.

Referring to FIG. 9, a method 900 begins by receiving a first signal from a communication channel, as shown in a block 910, at substantially the same time that the method 900 performs encoding of a second LDPC coded signal, as shown in a block 912. Then, the method 900 continues by storing the first LDPC coded signal in a memory 920, as shown in a block 920, at substantially the same time that the method 900 performs launching of the second LDPC coded signal into the communication channel, as shown in a block 922. The method 900 then continues by decoding the first LDPC coded signal 930 that has been stored in memory.

It is also noted that converse type operations could also be performed (e.g., decoding one signal that has been stored in memory while launching another signal into the communication channel, etc.). The use of appropriate memory management approaches and methods allows the processing of one signal (i.e., either encoding or decoding), while launching another signal into the communication channel or receiving another signal from the communication channel. Other variations can also be performed, borrowing on such memory management approaches, without departing from the scope and spirit of the invention.

It is also noted that the methods described within the preceding figures may also be performed within any appropriate system and/or apparatus designs (e.g., communication systems, communication devices, communication transmitters, communication receivers, communication transceivers, and/or functionality described) without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
    a circuitry for performing both:
        calculation of a parity bit that is generated when encoding a first information bit using an LDPC (Low Density Parity Check) matrix such that the first information bit and the parity bit form at least part of a first LDPC coded signal; and
        syndrome checking calculation during decoding processing of a second LDPC coded signal using the LDPC matrix to determine a best estimate of a second information bit encoded within the second LDPC coded signal, wherein the syndrome checking calculation involving determining a syndrome associated with the best estimate of the second information bit encoded; and wherein:
    the circuitry includes a plurality of XOR (exclusive OR) logic gates, implemented in an array arrangement such that each XOR gate of the plurality of XOR gates corresponds to a non-zero element of the LDPC matrix, and a plurality of MUXs (multiplexors) that is operable to modify the connectivity of a subset of the plurality of XOR gates that corresponds to at least one column of the LDPC matrix that is employed to generate the parity bit;
    a select signal is operable to select a first connectivity of each MUX when the circuitry using the LDPC matrix performs encoding of the first information bit to form the first LDPC coded signal; and
    the select signal is operable to select a second connectivity of each MUX when the circuitry using the LDPC matrix performs decoding processing on the second LDPC coded signal.

2. The apparatus of claim 1, wherein:
the apparatus is a communication device; and
the communication device is implemented within at least one of a satellite communication system, a wireless communication system, a wired communication system, and a fiber-optic communication system.

3. The apparatus of claim 1, wherein:
the parity bit is a first parity bit;
the first parity bit is provided to a portion of the circuitry that is operable to calculate a second parity bit; and
the first information bit, the first parity bit, and the second parity bit form at least part of the first LDPC coded signal.

4. The apparatus of claim 1, wherein:
the first LDPC coded signal is launched into a communication channel; and
the second LDPC coded signal is received from the communication channel.

5. The apparatus of claim 1, wherein:
the first LDPC coded signal is launched into a communication channel;
the second LDPC coded signal is received from the communication channel; and
the communication channel is a read channel that is coupled to a storage media of a hard disk drive (HDD).

6. The apparatus of claim 1, further comprising:
a memory for:
    storing the second LDPC coded signal while encoding the first information bit to form the first LDPC coded signal; and
    storing the first LDPC coded signal while performing decoding processing on the second LDPC coded signal.

7. The apparatus of claim 1, wherein:
the first LDPC coded signal is launched into a communication channel during a first time; and
the second LDPC coded signal is received from the communication channel during a second time; and further comprising:
a memory for:
    storing the second LDPC coded signal while encoding the first information bit to form the first LDPC coded signal; and
    storing the first LDPC coded signal while performing decoding processing on the second LDPC coded signal.

8. The apparatus of claim 1, wherein:
the LDPC matrix corresponds to an LDPC code that is systematic.

9. The apparatus of claim 1, wherein:
the LDPC matrix can partitioned into a first sub-matrix and a second sub-matrix;
the second sub-matrix includes at least one column of the LDPC matrix that is employed to generate the parity bit;
the second sub-matrix is a lower triangular matrix such that each non-zero valued element within the second sub-matrix is situated either along a diagonal of the second sub-matrix or below the diagonal of the second sub-matrix; and the diagonal being defined as traversing the second sub-matrix from an upper-left-most element of the second sub-matrix to a lower-right-most element of the second sub-matrix.

10. The apparatus of claim 1, wherein:
the circuitry is a first circuitry of the apparatus;
the apparatus includes the first circuitry and a second circuitry; and
the apparatus employs both the first circuitry and the second circuitry during decoding processing of the second LDPC coded signal to determine the best estimate of the second information bit encoded within the second LDPC coded signal.

11. The apparatus of claim 1, wherein:
the apparatus is a communication transceiver for:
transmitting the first LDPC coded signal via a first communication channel; and
receiving the second LDPC coded signal from a second communication channel.

12. The apparatus of claim 11, wherein:
the decoder circuitry also employs at least one additional circuitry during decoding processing of the second LDPC coded signal to determine the best estimate of the second information bit encoded within the second LDPC coded signal.

13. The apparatus of claim 11, wherein:
the apparatus is a communication device; and
the communication device is implemented within at least one of a satellite communication system, a wireless communication system, a wired communication system, and a fiber-optic communication system.

14. The apparatus of claim 11, wherein:
the parity bit is a first parity bit;
the first parity bit is provided to a portion of the circuitry that is operable to calculate a second parity bit; and
the first information bit, the first parity bit, and the second parity bit form at least part of the first LDPC coded signal.

15. The apparatus of claim 11, wherein:
the first LDPC coded signal is launched into a communication channel during a first time; and
the second LDPC coded signal is received from the communication channel during a second time; and further comprising:
a memory for:
storing the second LDPC coded signal while encoding the first information bit to form the first LDPC coded signal; and
storing the first LDPC coded signal while performing decoding processing on the second LDPC coded signal.

16. An apparatus, comprising:
an encoder circuitry for encoding a first information bit using an LDPC (Low Density Parity Check) matrix such that the first information bit and the parity bit form at least part of a first LDPC coded signal;
a decoder circuitry for employing the LDPC matrix to decode a second LDPC coded signal using the LDPC matrix to determine a best estimate of a second information bit encoded within the second LDPC coded signal;
and wherein:
the encoder circuitry and the decoder circuitry both employ a shared circuitry that is operable to perform both:
calculation of the parity bit that is generated when encoding the first information bit using the LDPC matrix such that the first information bit and the parity bit form at least part of the first LDPC coded signal; and
syndrome checking calculation during decoding processing of a second LDPC coded signal to determine a best estimate of a second information bit encoded within the second LDPC coded signal, wherein the syndrome checking calculation involving determining a syndrome associated with the best estimate of the second information bit encoded; and wherein:
the shared circuitry includes a plurality of XOR (exclusive OR) logic gates, implemented in an array arrangement such that each XOR gate of the plurality of XOR gates corresponds to a non-zero element of the LDPC matrix, and a plurality of MUXs (multiplexors) that is operable to modify the connectivity of a subset of the plurality of XOR gates that corresponds to at least one column of the LDPC matrix that is employed to generate the parity bit;
a select signal is operable to select a first connectivity of each MUX when the circuitry using the LDPC matrix performs encoding of the first information bit to form the first LDPC coded signal; and
the select signal is operable to select a second connectivity of each MUX when the circuitry using the LDPC matrix performs decoding processing on the second LDPC coded signal.

17. A method performed in a communication device, the method comprising:
encoding a first information bit using an LDPC (Low Density Parity Check) matrix that includes calculating a parity bit such that the first information bit and the parity bit form at least part of a first LDPC coded signal; and
decoding a second LDPC coded signal using the LDPC matrix, to determine a best estimate of a second information bit encoded within the second LDPC coded signal, that includes performing a syndrome checking calculation that involves determining a syndrome associated with the best estimate of the second information bit encoded, and wherein:
the encoding and the syndrome checking calculation being performed using a shared circuitry;
the shared circuitry includes a plurality of XOR (exclusive OR) logic gates, implemented in an array arrangement such that each XOR gate of the plurality of XOR gates corresponds to a non-zero element of the LDPC matrix, and a plurality of MUXs (multiplexors) that is operable to modify the connectivity of a subset of the plurality of XOR gates that corresponds to at least one column of the LDPC matrix that is employed to generate the parity bit; and further comprising:
selecting a first connectivity of each MUX when the circuitry using the LDPC matrix performs encoding of the first information bit to form the first LDPC coded signal; and
selecting a second connectivity of each MUX when the circuitry using the LDPC matrix performs decoding processing on the second LDPC coded signal.

18. The method of claim 17, wherein:
the communication device is implemented within at least one of a satellite communication system, a wireless communication system, a wired communication system, and a fiber-optic communication system.

19. The method of claim 17, further comprising:
launching the first LDPC coded signal into a communication channel during a first time; and
receiving the second LDPC coded signal from the communication channel during a second time; and either:

storing the second LDPC coded signal while encoding the first information bit to form the first LDPC coded signal; or storing the first LDPC coded signal while performing decoding processing on the second LDPC coded signal.

20. The method of claim 17, wherein:

the LDPC matrix corresponds to an LDPC code that is systematic;

the LDPC matrix can partitioned into a first sub-matrix and a second sub-matrix;

the second sub-matrix includes at least one column of the LDPC matrix that is employed to generate the parity bit;

the second sub-matrix is a lower triangular matrix such that each non-zero valued element within the second sub-matrix is situated either along a diagonal of the second sub-matrix or below the diagonal of the second sub-matrix; and the diagonal being defined as traversing the second sub-matrix from an upper-left-most element of the second sub-matrix to a lower-right-most element of the second sub-matrix.

\* \* \* \* \*

UNITED STATES PATENT AND TRADEMARK OFFICE
CERTIFICATE OF CORRECTION

PATENT NO.        : 7,752,529 B2                                        Page 1 of 1
APPLICATION NO.   : 11/493342
DATED             : July 6, 2010
INVENTOR(S)       : Tak K. Lee et al.

It is certified that error appears in the above-identified patent and that said Letters Patent is hereby corrected as shown below:

Col. 10, line 59, In Claim 9: after "can", insert --be--
    Col. 13, line 9, In Claim 20: after "can", insert --be--

Signed and Sealed this
Twenty-seventh Day of March, 2012

David J. Kappos
*Director of the United States Patent and Trademark Office*